(12) United States Patent
Puthoff et al.

(10) Patent No.: US 11,777,198 B1
(45) Date of Patent: *Oct. 3, 2023

(54) COMMUNICATIONS SYSTEM (71) Applicant: Quantcomm LLC, Austin, TX (US)

(72) Inventors: Harold E. Puthoff, Austin, TX (US); Christopher A. Eusebi, Bloomfiled Township, MI (US)

(73) Assignee: Quantcomm LLC, Austin, TX (US)

( * ) Notice: Subject to any disclaimer, the term of this patent is extended or adjusted under 35 U.S.C. 154(b) by 16 days.

This patent is subject to a terminal disclaimer.

(21) Appl. No.: 17/241,853

(22) Filed: Apr. 27, 2021

Related U.S. Application Data (63) Continuation of application No. 16/518,618, filed on Jul. 22, 2019, now Pat. No. 10,992,035, which is a continuation-in-part of application No. 15/330,276, filed on Aug. 31, 2016, now Pat. No. 10,361,792.

(51) Int. Cl.
*H01Q 1/36* (2006.01)
*G01R 33/035* (2006.01)
*H01Q 1/04* (2006.01)
*H01Q 1/52* (2006.01)
*H01Q 15/00* (2006.01)

(52) U.S. Cl.
CPC ......... *H01Q 1/364* (2013.01); *G01R 33/0358* (2013.01); *H01Q 1/04* (2013.01); *H01Q 1/526* (2013.01); *H01Q 15/004* (2013.01)

(58) Field of Classification Search
CPC ............ H01Q 1/38; H01Q 1/36; H01Q 1/246; H01Q 21/205; H01Q 21/28; H01Q 1/243; H01Q 9/0407; H01Q 1/44; H01Q 15/0093; H01Q 21/20; H01Q 9/40; H01Q 1/48; H01Q 5/357; H01Q 5/371; H01Q 1/526; H01Q 1/34; H01Q 3/26; H01Q 7/00; H01Q 9/20; H01Q 1/26
USPC .......................................... 455/40
See application file for complete search history.

(56) References Cited

U.S. PATENT DOCUMENTS

| | | | | |
|---|---|---|---|---|
| 5,185,578 A | * | 2/1993 | Stolarczykz | G01V 3/30 324/338 |
| 5,845,220 A | * | 12/1998 | Puthoff | H04B 5/0075 455/899 |
| 2008/0008045 A1 | * | 1/2008 | Basilico | G01S 3/8083 367/128 |
| 2010/0009854 A1 | * | 1/2010 | Sato | H01B 12/02 505/210 |
| 2014/0000630 A1 | * | 1/2014 | Ford | A61B 5/0042 128/845 |
| 2017/0201224 A1 | * | 7/2017 | Strong | H03H 7/185 |

* cited by examiner

*Primary Examiner* — Ajibola A Akinyemi
(74) *Attorney, Agent, or Firm* — McGuire Woods LLP (57) ABSTRACT

A communication system using vector and scalar potential is disclosed. The system uses field-free potentials signaling for many applications where the absence of shielding effects in sea water, plasma or other dense media due to the fact that the absence of (E,B) fields eliminates the possibility of induced charge and current response in the media being transited.

19 Claims, 7 Drawing Sheets

$A\Theta = (\gamma_\Theta I R^2)/2r$

Fig 1.

slits

Double slit pattern, shifted

COMMUNICATIONS SYSTEM

RELATED APPLICATIONS

This application is a continuation of U.S. patent application Ser. No. 16/518,618 filed Jul. 22, 2019, which is a continuation-in-part of U.S. patent application Ser. No. 15/330,276 filed Aug. 31, 2016. These applications are incorporated herein in their entirety.

FIELD

The present disclosure relates to communication and navigation devices and more particularly to devices which can communicate through mediums which normally block electromagnetic radiation.

BACKGROUND AND SUMMARY

This section provides background information related to the present disclosure which is not necessarily prior art. This section provides a general discussion as well as a summary of the disclosure and is not a comprehensive disclosure of its full scope or all of its features. Despite the derivative relationships between fields and potentials, their distributions in space do not necessarily overlap at all spatial positions.

Institutions are always looking for methods and systems to allow efficient communications in various difficult situations and areas. To improve communications, engineers have looked to various transmission methodologies including the digital and analog modulation of the transmission electromagnetic signals. These electromagnetic signals, depending upon their appropriate frequencies and environments suffer from a catalog of deficiencies related to transmissibility and permeability of the media associated with the electromagnetic signals.

Figure 1:
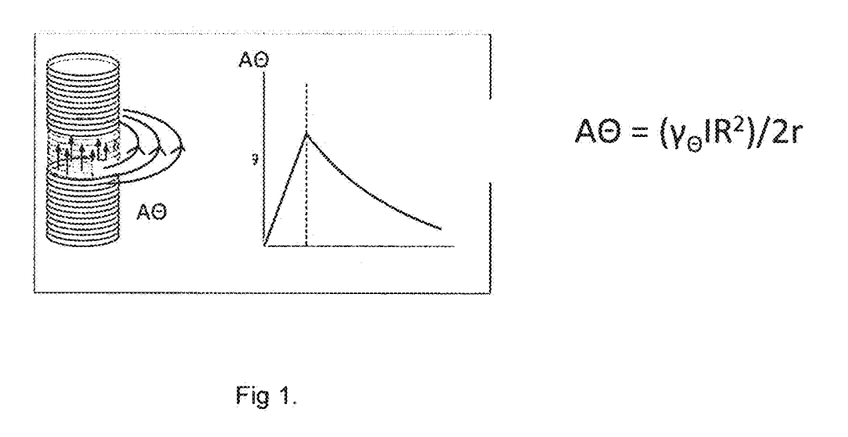
FIG. 1 represents the generation of vector and scalar potential fields.

As described below, to overcome these deficiencies, people have looked to the fundamentals of Electromagnetic wave transmission to improve communications. Research has been conducted into using near field vector potential in communication. FIG. 1, an iconic example that maximizes the disparity is that of an infinitely long solenoid in which a DC magnetic field B is entirely contained within the solenoid (i.e., none exterior) due to encircling current-carrying coil turns, while surrounding the solenoid is an exterior circling vector potential A that drops off as 1/r.

This then begs the question as to whether the existence of the magnetic field interior to the solenoid can be determined on the basis of an exterior measurement of A alone. According to the present teachings, systems are provided to allow the measurement on the basis of quantum interference. This is due to the fact that the phases of quantum wave functions are modulated by vector and scalar potentials as $$\Delta \phi = \frac{q}{\hbar} \int A \cdot dr - \frac{q}{\hbar} \int \varphi dt$$

Figure 2:
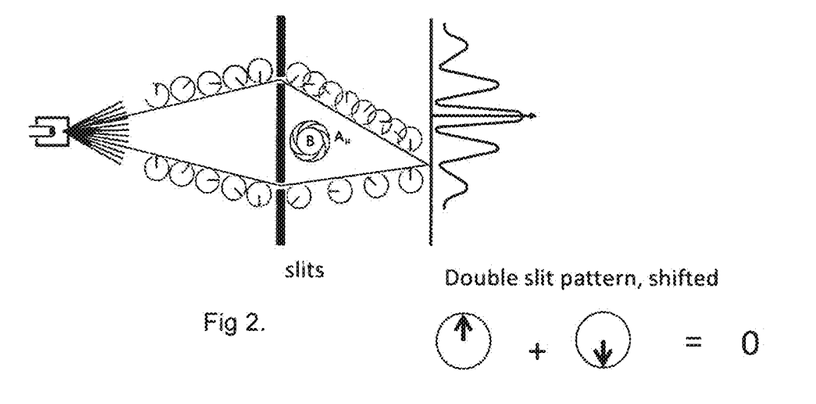
FIG. 2 represents an electromagnetic wave signal through a diffraction grating.

Therefore, in the case of the solenoid as shown in FIG. 2, electron waves passing on either side of the solenoid, when recombined, register the presence of the magnetic field without direct contact due to a shift in interference pattern determined by the enclosed magnetic flux $\Phi_{mag}$, viz:

$$\delta(\Delta \phi) = \frac{q}{\hbar} \int_{upper\ path} A \cdot dr - \frac{q}{\hbar} \int_{lower\ path} A \cdot dr = \frac{q}{\hbar} \oint A \cdot dr = \frac{q}{\hbar} \Phi_{mag}$$

where the appearance of $\Phi_{mag}$ is an outcome of the application of Stokes' Law, $$\Phi_{mag} = \int B \cdot da = \int \nabla \times A \cdot da = \oint A \cdot dr$$

Several patents disclose attempts to use vector potential for communications. For example, L. M. Hively, "Systems, apparatuses, and methods for generating and/or utilizing scalar-longitudinal waves," U.S. Pat. No. 9,306,527 B1, issued Apr. 5, 2016. The patent is based on a speculatively-expanded form of electromagnetic theory which the inventor labels MCE (More Complete Electrodynamics). Though there is no reference to previously published literature on the MCE, the expanded form of electromagnetic theory he uses was originated over a decade ago by a researcher in the Netherlands and widely circulated: Koen J. van Vlaenderen, "A generalization of classical electrodynamics for the predication of scalar field effects." In addition to the usual EM fields and potentials (E, B, A, φ) the expanded form of electrodynamics posits an additional scalar field C which, when introduced into the standard Maxwell equations, modifies them as follows (Eqns. 6 and 7 in the patent):

$$\nabla \times B - \frac{1}{c^2} \frac{\partial E}{\partial t} - \nabla C = \mu J, \nabla \cdot E + \frac{\partial C}{\partial t} = \frac{\rho}{\varepsilon}$$

The proposed scalar field C is shown to satisfy a standard sourced wave equation of the form (Eqn. 8 in the patent):

$$\frac{1}{c^2} \frac{\partial^2 C}{\partial t^2} - \nabla^2 C = \mu \left( \frac{\partial \rho}{\partial t} + \nabla \cdot J \right)$$

It is at this point that the instantiation of the proposed modified EM system appears to not be supported by observation, given that sourcing of the C scalar field requires that electrical charge not be conserved given that the term on the righthand side of the above equation vanishes for charge conservation, i.e., for $\nabla \cdot J = -\partial \rho / \partial t$. To date there has been no observational evidence for violation of charge conservation in the very mature field of electrodynamics, and as such those skilled in the art will recognize that the proposed teachings are suspect. Claims that follow in the patent that are based on the MCE theory (e.g., propagation of scalar C waves through EM shielding) have no empirical support for being exploitable.

Additionally at low frequencies such conditions are satisfied in the foreground near-field of an AC-driven caduceus-like structure shown in the leading figure of a patent granted to the author: H. E. Puthoff, "Communication Method and Apparatus with Signals Comprising Scalar and Vector Potentials without Electromagnetic Fields," U.S. Pat. No. 5,845,220, issued 1 Dec. 1998. Under appropriate antenna design conditions, the required field-free potentials conditions are also met for far-field propagation. As described in the Putnoff application, incorporated herein in its entirety by reference, the potentials field structure was that of a near field distribution involving induction fields in the close vicinity of the field-generating structure. Given the novelty of the EM field-free potentials claim at the time, the simplest field structures were chosen to demonstrate the principle in a way that could be easily understood and implemented in the laboratory. Though useful for academic demonstration purposes, its use as a communication technology was limited since the utilization of radiation fields for far-field information transmission was not addressed in any detail. The present patent application, however, addresses this lacuna as it is specifically designed for use as a long-range communication technology.

According to the present teachings, when an antenna structure is excited by a driving current, fields are generated by the resulting charge and current distributions. In the most general case, the fields can be considered to be a superposition of two specific types of field, so-called induction fields and radiation fields whose characteristics markedly differ. Vector and Scalar potential fields in the immediate vicinity of the structure, the local fields, are labeled near fields or induction fields, and are characterized as being tied to the antenna structure; the electric fields end on charges in the antenna and the magnetic fields encircle currents in the antenna. The near fields also have the characteristic that they fall off rapidly with distance, declining as $1/r^n$ where $n>1$.

According to the present teaching, a communication system using vector and scalar potential is disclosed. The Vector and Scalar potential radiation fields (or far fields) break away from the antenna structure and propagate off into space as self-contained entities, declining more slowly with distance, specifically as $1/r$. The reason is that the A-phi signal does not carry energy, only information, there is no inverse-square drop-off.

According to the present teaching, a communication system using vector and scalar potential is disclosed. The system uses field-free potentials signaling for many applications where the absence of shielding effects in sea water, plasma or other dense media due to the fact that the absence of (E,B) fields eliminates the possibility of induced charge and current response in the media being transited.

According to the present teaching, a communication system using vector and scalar potential is disclosed. The system uses field-free potentials signaling the Inverse r instead of inverse $r^2$ drop-off with distance. Generally, the system provides signals which are nondetectable by third parties using standard (E,B) detectors, which rely on induced charge and current distributions for registration.

According to the present teaching, a navigation system is provided having a plurality of transmitters positioned at known predetermined locations in time and space, the transmitters respectively producing distinguishable A and phi fields. The system includes a receiver configured to receive the A and Phi fields and convert the A and phi fields into a signal on an electromagnetic spectrum. A circuit is provided which is configured to calculate a location based on the signal on an electromagnetic spectrum. A cooling system configured to cool a portion of the receiver to below a temperature where a receiving element possesses superconducting properties. This can be, in the instance today's superconducting materials, to a temperature below liquid nitrogen temperature.

According to the present teaching, the system described above where the receiver comprises a Josephson Junction configured to producing a signal at a resonant frequency having a first phase, and in the presence of the distinguishable A and Phi fields producing a signal at the first frequency having a second phase.

According to the present teaching, the system described above further includes a circuit configured to detect a change from the first phase to a second phase and to produce a signal indicative of the distinguishable A and Phi fields.

According to the present teachings, a system for communicating between two locations is provided. The system includes an antenna configured to produce an EM field having a vector potential A and a scalar potential phi. A shield configured to block the EM field is disposed between the two locations. A superconducting quantum receiver is disposed a receiver location, the receiver location being configured to receive the A and Phi fields and convert the A and phi fields into an electromagnetic signal.

According to the present teachings, a system for communicating with a submarine is provided. The system includes an antenna configured to produce an EM field having a vector potential A and a scalar potential phi. A shield configured to block the EM field is disposed between the antenna and the submarine. A quantum receiver is disposed within the submarine, the receiver configured to receive the A and Phi fields and convert the A and phi fields into an electromagnetic signal. The system includes a cooling system configured to cool a portion of the receiver into a superconducting state, the temperature being below liquid nitrogen temperature.

According to the present teachings, the system for communicating with a submarine described above includes a Josephson junction having a first produced resonant frequency. The Josephson junction converts the received A and phi fields into phase changes in the first produced resonant frequency.

According to the present teachings, the system for communicating with a submarine described above includes a receiver having a radio circuit configured to receive emissions from the Josephson junction using an antenna, and receive signals directly from the Josephson junction from a current through the Josephson junction.

According to the present teachings, the system for communicating with a submarine described above includes a SQUID magnetic sensor shielded from magnetic fields.

According to the present teachings, the system for communicating with a submarine described above includes a transmitter having an antenna positioned on one of a satellite, an above ground fixed location, on a subterranean location or beneath a surface of the ocean.

According to the present teachings, the system for communicating with a submarine described above includes at least three antennas positioned at various locations.

According to the present teachings, the system for communicating with a submarine described above includes a receiver having a circuit configured to calculate a location of the submarine with respect to the at least three antennas using triangulation.

According to the present teachings, the system for communicating with a submarine described above where each of the at least three antennas emits an A and Phi signals indicative of a time signal and a location.

According to the present teachings, the system for communicating with a submarine described above where the shield is saltwater.

According to the present teachings, a system for receiving shielded computer and telecom signals disposed within a faraday cage is presented. The system includes a receiver configured to receive A and Phi fields which pass through the faraday cage. The receiver has a Josephson junction producing a signal at a resonant frequency having a first phase, and in the presence of an A or Phi field producing a signal at the first frequency having a second phase.

According to the present teachings, the system described above includes a circuit configured to detect the changes in phase and produce a signal indicative of changes in the A and phi fields.

According to the present teachings, the system described above wherein the A and phi signals are amplitude modulated and wherein the circuit is configured to detect changes in the A and phi fields, and thereby detects the amount of phase change in the resonant frequency and converts this to a signal indicative of the amplitude modulated signal.

According to the present teachings, the system described above wherein the A and phi signals are frequency modulated signals and wherein the circuit is configured to detect changes in the A and phi fields and detects the speed of the phase change in the resonant frequency and converts this to a signal indicative of the frequency modulated signals.

According to the present teachings, the system described above wherein the A and phi signals encode digital signals transmitted at a transmission frequency and wherein the circuit is configured to detect changes in the A and phi fields, and thereby detects the amount of phase change in the resonant frequency and converts this to a signal indicative of the digital signals.

According to the present teachings, the system described above wherein the A and phi signals are phase modulated signals and wherein the circuit is configured to detect changes in the A and phi fields, and thereby detects the amount of phase change in the phase change in the resonant frequency and converts this to a signal indicative of the phase modulated signal.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings. Communication by electromagnetic means is based on the application of Maxwell's equations to the design of efficient apparatus for the transmission and detection of electromagnetic signals. In standard application the signal consists of electromagnetic waves of specified structure whose intertwined electric and magnetic field components constitute the carrier of the information to be transmitted. Such signal transmission has the characteristic that (a) the media through which the signal propagates typically act to absorb, disperse or shield the signals to some degree, depending on the properties of the intervening media (e.g., dust, plasma), and (b) the overall state of the art is sufficiently developed that it is difficult to deny access to unwanted third parties.

According to the present teachings and based on the development of quantum detection devices, heretofore-neglected solutions of Maxwell's equations can be implemented that result in the design and development of technology based on "stealthy" EM signal propagation whose electric and magnetic field components are suppressed. In their place are utilized the underlying, standard vector and scalar potentials (A,$\phi$), that, by virtue of quantum processes, can be generated and detected independently of the presence or absence of electric and magnetic field components. The transmission, absorption, dispersion, shielding and detection characteristics of field-free potentials signaling offer certain advantages over ordinary EM signaling for many applications, e.g., propagation through sea water, plasma or other dense media without degradation or interference, and only inverse r instead of inverse $r^2$ drop-off with distance.

In classical electromagnetic theory the electric and magnetic fields (E,B) act as force carriers between charged particles. These fields are detectable by observing the effects of the fields on the motion of charges according to the Lorentz force equation, $F=q(E+v\times B)$. Historically, field-associated vector and scalar potentials (A,$\phi$) were introduced to simplify calculations, but were originally thought not to be of independent physical significance. This was because the potentials could be changed (mathematically) by adding space or time derivatives of arbitrary scalar functions without altering the fields, which were taken to be of primary physical significance. However, with the advent of quantum electrodynamics the vector and scalar potentials, as opposed to the fields, have emerged as the fundamental field entities.

As a result, in quantum mechanics the potentials are found to play a primary role, and their use cannot be eliminated by use of fields alone. As a specific example, Aharonov and Bohm published a landmark paper predicting that potential-induced shifts in the phase of electron quantum (de Broglie) waves caused by their passage through regions of field-free potential (FFP) would be observable by means of suitable interferometers. See Y. Aharonov and D. Bohm, "Significance of electromagnetic potentials in the quantum theory" Phys. Rev. 115, 485-491 (1959). In tests of this hypothesis experimenters find the predicted interference fringe shifts in electron beam interferometers, shifts that depend only upon a vector potential in a field-free region (i.e., $B=\nabla\times A=0$) that is generated by an isolated magnetic flux bundle enclosed by the interferometer legs. These observations confirm the existence of observable field-free potential effects on the electrons, given that the electron interference pattern is perturbed even though the electron trajectories transit field-free regions only. The Aharonov-Bohm Effect is now a widely-explored and well-established phenomenon. R. P. Feynman, R. Leighton and M. Sands, *The Feynman Lectures in Physics*, vol. 2, Section 15-5 (Addison-Wesley, Reading, MA, 1964).

The connection between field-free potentials (FFPs) and the standard EM formulation can be seen as follows. In classical electromagnetic theory, the relationships between electric and magnetic fields E and B, and their generation by charge and current sources ρ and J are codified in the form of Maxwell's equations, which, with $D=\varepsilon_0 E$, $B=\mu_0 H$, are given by:

$$\nabla x E = -\frac{\partial B}{\partial t}$$

$$\nabla x H = J + \frac{\partial D}{\partial t}$$

$\nabla \cdot D = \rho$ $\nabla \cdot B = 0$

These equations, supplemented by boundary conditions, yield the field distributions for given source configurations.

For particular geometries, it is convenient to introduce as an intermediary in the solution of Maxwell's equations the potential functions (A,ϕ), where A is the vector (magnetic) potential and ϕ is the scalar (electric) potential. The defining equations for (A,ϕ) are introduced by the substitutions $B = \nabla x A$ $$E = -\nabla \phi - \frac{\partial A}{\partial t}$$

in which case Maxwell's equations reduce to $$\nabla^2 \phi - \frac{1}{c^2}\frac{\partial^2 \phi}{\partial t^2} = -\frac{\rho}{\varepsilon_o}$$

$$\nabla^2 A - \frac{1}{c^2}\frac{\partial^2 A}{\partial t^2} = \frac{J}{\varepsilon_o c^2}$$

$$c^2 \nabla \cdot A + \frac{\partial \phi}{\partial t} = 0$$

The scalar potential ϕ is shown in terms of the charge distribution ρ alone, while the vector potential A in terms of the current distribution J alone, and constraining (Lorentz gauge) condition relates the two potentials.

For the field-free potentials electromagnetics option, the specialized case is where the fields are arranged to vanish in a region of free space that constitutes the transmission medium of interest. That is, the magnetic field is set to vanish by virtue of being curl-free (a condition met, e.g., in the vicinity of a current-driven solenoid or toroid or off the end of a short dipole antenna), and the electric field is set to vanish by virtue of a cancellation of the $\nabla \phi$ and $\partial A/\partial T$ components, should they exist. Thus, one can generate field-free potentials (A,ϕ) signaling field in which the electric and magnetic field (E,B) components are suppressed, with direct detection of the (A,ϕ) field required in their stead.

Figure 3A:
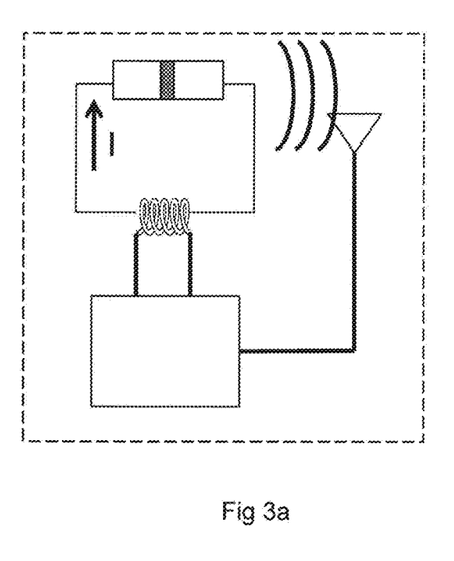
FIG. 3a represents a Josephson junction incorporated into a communications system.
Figure 3B:
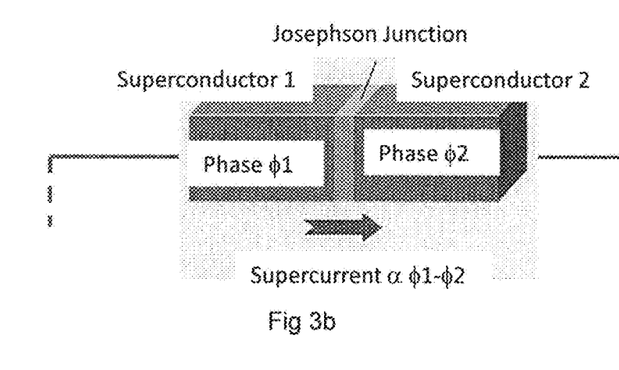
FIGS. 3b and 3c represent a SQUID to be incorporated into a communications system.

As Shown in FIG. 3a, the receiver in the form of a Josephson Junction (Josephson Junction) is a superconducting quantum interference device (SQUID) where two superconducting regions are separated by a thin insulating barrier (see below). Nonetheless, due to the thinness of the Josephson Junction, the quantum wave functions in the two superconducting regions overlap in the Josephson Junction due to tunneling of superconducting Cooper pairs of electrons between the two superconducting regions. Therefore, though the Josephson Junction is not made of a superconducting material, it acts as a superconductor and permits supercurrent flowthrough. The Josephson Junction thus acts as a one-legged interference device also subject to quantum wave interference effects associated with the vector and scalar potentials.

Specifically, the superconducting current density through the Josephson Junction is given by $$J = J_0 \sin\left(\delta_0 + \frac{q}{\hbar}\int A \cdot dr - \frac{q}{\hbar}\int \varphi dt\right)$$

where q=−2e for the Cooper-pair electrons that constitute the superconducting current. For a fixed DC voltage across the Josephson Junction, φ=V, from above we can calculate that the current oscillates at a frequency 483 MHz/μV, resulting in what is known as the AC Josephson Effect.

We now examine the case of detection of field-free potentials. For communication purposes such potentials can be created by ordinary EM antenna arrays where the EM field-free (A,ϕ) signals are typically found in the nulls of the EM field distributions (as an example, off the end of a short dipole antenna), or specifically generated by appropriate geometries (e.g., A,φ signal generation by radial currents in a spherical geometry). For practical reasons, it is convenient to use COTS (commercial off-the-shelf such, for example, SQUIDs that operate at liquid nitrogen temperatures (77° K) available from STAR Cryoelectronics, LLC, in Santa Fe, NM.) SQUIDs that are often in the form of a parallel pair of Josephson Junctions which are convenient for measuring magnetic fields as shown below in FIG. 3c.

Figure 3C:
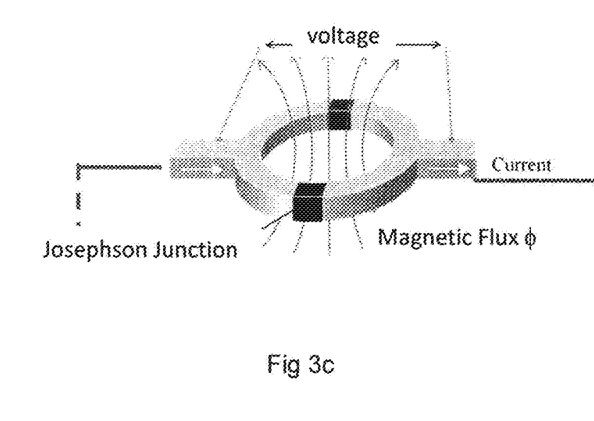

Here, as was the case in the double slit experiment described above and graphed in the accompanying Figure, the presence of magnetic flux threading the loop results in differing phase accumulations for the currents through the two Josephson Junctions, each of which is proportional to a term involving $(q/\hbar)\int A \cdot dr$. The sum of the resulting currents, i.e., the net current, is once again a function of the threaded magnetic flux $\Phi_{mag}=\int B \cdot da = \oint A \cdot dr$. As described below, a SQUID be used to detect field-free potentials.

In the absence of fields the super currents the Josephson Junctions in a SQUID splits in two, half traversing one leg of the loop, half traversing the other. In the absence of EM fields the phase accumulations are identical in the two halves. The configuration thus simply constitutes two current paths in parallel. Application of a DC voltage across the Josephson Junction pair then results in the oscillating-current AC Josephson Effect. Now, with the arrival of an EM field-free (A,φ) signal, phase changes in the oscillating supercurrent through the pair of Josephson Junctions result as a function of changes in the argument of the sine function, and these (A,φ)-induced changes in the current can be tracked by appropriate instrumentation as outlined in, e.g., the operation manuals accompanying the SQUIDs.

In the navigation and communications systems described herein, Electromagnetic (EM) communication system antenna designs are typically designed using the EM-associated vector and scalar potentials (rather than the EM fields themselves) due to their mathematical form as simple wave equations driven by current and charge densities, viz:

$$\nabla^2 A - \frac{1}{c^2}\frac{\partial^2 A}{\partial t^2} = -\mu_0 J$$

$$\nabla^2 \varphi - \frac{1}{c^2}\frac{\partial^2 \varphi}{\partial t^2} = -\frac{\rho}{\varepsilon_0}$$

where the relationship between the two potentials can be expressed in terms of a Lorentz-gauge condition $$\nabla \cdot A = -\frac{1}{c^2}\frac{\partial \phi}{\partial t}$$

Once solutions are obtained, the electric and magnetic fields can be obtained from $$B = \nabla \times A, \quad E = -\nabla\varphi - \frac{\partial A}{\partial t}$$

Figure 4:
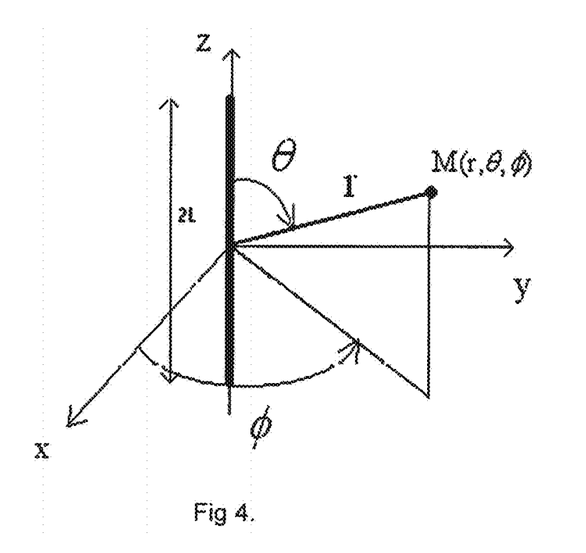
FIG. 4 represents a dipole antenna used according to the present teachings.

As shown in FIG. 4, a dipole antenna as shown here, driven by a sinusoidal current, it is possible to obtain a solution for the vector potential A followed by a solution for the scalar potential φ.

Solving we obtain $$A = \hat{1}_z \frac{\mu_0}{4\pi}\int_{-L}^{L}\frac{JdV}{r} \rightarrow \hat{1}_z \frac{\mu_0}{4\pi}\int_{-L}^{L}\frac{I\sin(\omega t - kr)}{r}dz \rightarrow \hat{1}_z \frac{\mu_0 IL}{2\pi r}\sin(\omega t - kr)$$

where the last transition holds for the case of antenna length 2L small compared to the wavelength of the radiation, and small compared to the distance r at which A is measured. The components of A and the solution for φ (the latter obtained from (3)) are then given by $$A_r = \frac{\mu_0 IL}{2\pi r}\cos\theta \sin(\omega t - kr)$$

$$A_\theta = -\frac{\mu_0 IL}{2\pi r}\sin\theta \sin(\omega t - kr)$$

$$A_\phi = 0$$

$$\varphi = \frac{IL}{2\pi\varepsilon_0 cr}\cos\theta\left[\sin(\omega t - kr) - \frac{1}{kr}\cos(\omega t - kr)\right]$$

where k=ω/c.

For the discussion that follows we spell out in detail the (E,B) field distributions;

$B_r = 0$ $B_\theta = 0$ $$B_\phi = \frac{\mu_0 IL}{2\pi r}\sin\theta\left[k\cos(\omega t - kr) + \frac{1}{r}\sin(\omega t - kr)\right]$$

$$E_r = \frac{IL}{\pi\varepsilon_0 r^2 c}\cos\theta\left[\sin(\omega t - kr) - \frac{1}{kr}\cos(\omega t - kr)\right]$$

$$E_\theta = \frac{IL}{2\pi\varepsilon_0 rc}\sin\theta\left[k\cos(\omega t - kr) + \frac{1}{r}\sin(\omega t - kr) - \frac{1}{kr^2}\cos(\omega t - kr)\right]$$

When far-field radiation from the transmitting antenna is developed in terms $1/r^n$ the EM fields (E,B) are proportional to sin θ, and thus drop to zero off the end of the dipole. In contrast to the EM field, the vector/scalar potential terms (A,φ) propagating off the end of the dipole are proportional to cos θ, and thus reach their peak value in that direction. As a result in the transition from a direction perpendicular to the antenna to that aligned with the antenna the field distributions smoothly transition from an (E,B) fields dominance to an (A,φ) fields dominance. Thus, for radiation the dipole off-end constitutes a source of pure-potential fields.

Figure 5:
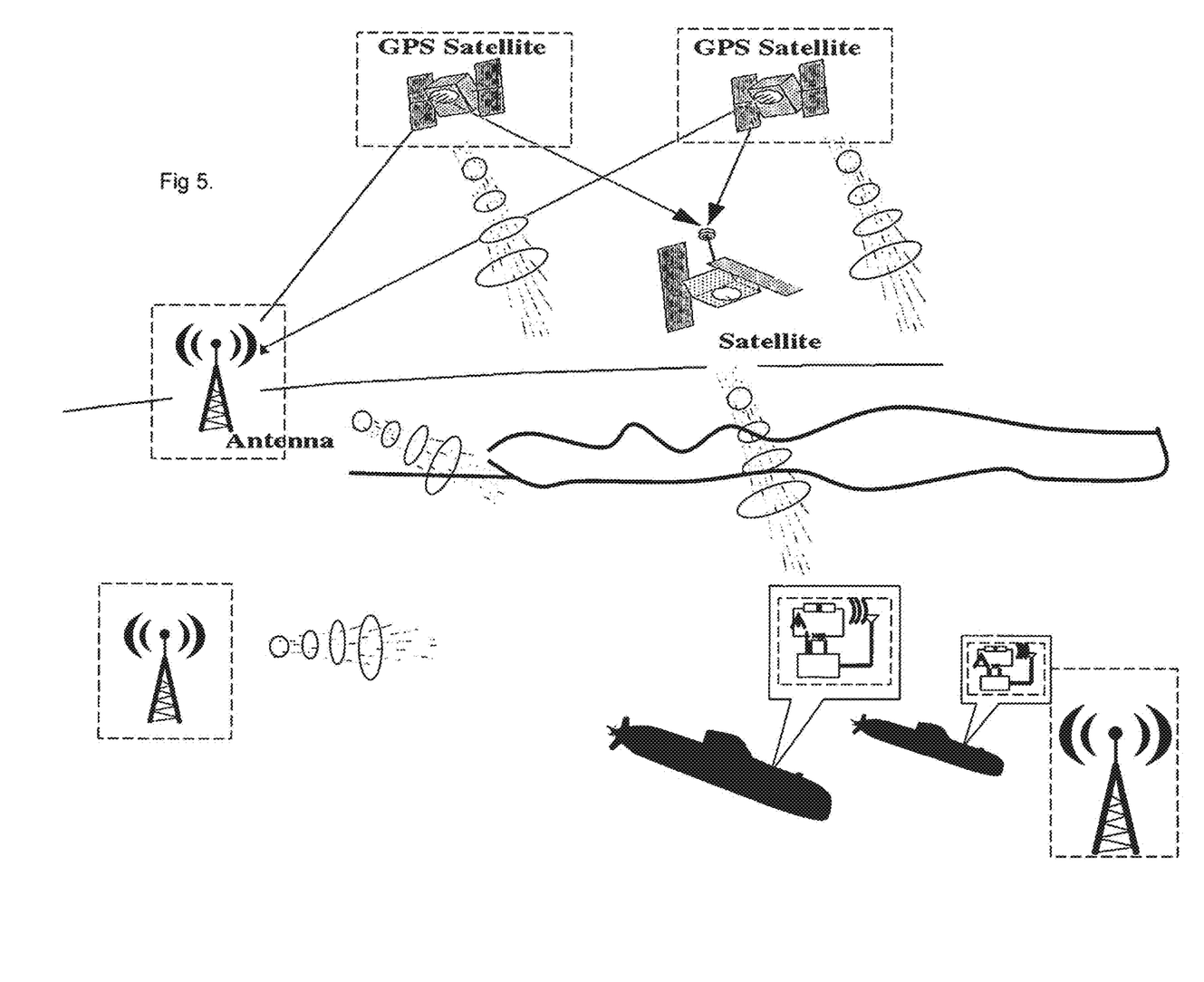
FIG. 5 represents a navigation and/or communication system.

As shown in FIG. 5, a navigation system 30 for transmitting a series of signals to be used for location functions is presented. The system 30 has a plurality of transmitters 20 which includes antennas 22 positioned at known predetermined locations in time and space. The transmitters 20 respectively produce distinguishable vector and scalar potentials at a frequency greater that 100 Mhz. Signals greater than about 100 Mhz is chose because it is known that EM fields at these frequencies do not travel through saltwater any significant distance. The transmitters or more particularly, the transmission antennas for the system for communicating with a submarine described above, includes a transmitter having an antenna positioned on one of a satellite, an above ground fixed location, on a subterranean location or beneath a surface of the ocean. According to the present teachings, the system for communicating with a submarine described above includes a receiver that has a circuit configured to calculate a location of the submarine with respect to the at least three antennas using triangulation. At least three antennas emit an A and Phi signals indicative of a time signal and a location.

The navigation system can have a plurality of transmitters positioned at known predetermined locations in time and space, said transmitters respectively producing distinguishable A and phi fields. The system has a receiver configured to receive the A and Phi fields and convert the A and phi fields into a signal on an electromagnetic spectrum. A circuit is associated with the receiver configured to calculate a location, based on the signal on an electromagnetic spectrum. A cooling system is provided which is configured to cool a portion of the receiver to below liquid nitrogen temperature. The receiver has a superconducting element which can be a Josephson Junction configured to producing a signal at a resonant frequency having a first phase, and in the presence of the distinguishable A and Phi fields producing a signal at the first frequency having a second phase. The circuit is configured to detect a change from the first phase to a second phase and to produce a signal indicative of the distinguishable A and Phi fields. Optionally, the receivers can include a 3-D rosette of superconducting Josephson Junctions.

The system 30 includes receiver 34 configured to receive the A and Phi fields and convert the A and phi fields into a signal on an electromagnetic spectrum. A circuit 37 is configured to calculate a location based on the signal on an electromagnetic spectrum associated with the receiver. Associated with the receiver is a cooling system configured to cool a portion of the antenna, (which can be a superconducting antenna) to place the antennas in a superconducting state, and generally to a temperature below liquid nitrogen temperature.

The superconducting antenna can include a Josephson Junction configured to producing a signal at a resonant frequency having a first phase, and in the presence of the distinguishable A and Phi fields producing a signal at the first frequency having a second phase. The circuit 37 is configured to detect a change from the first phase to a second phase and to produce a signal indicative of the distinguishable A and Phi fields.

Because EM radiation is generally not detectable at depths greater than thirty (30) meters, the system 30 can be used to navigate and communicate with submarine 32 disposed greater than thirty (30) meters beneath saltwater. The system 30 includes a transmitting antenna 22 disposed outside of the submarine 32, the transmitting antenna 22 being configured to produce an EM field having a frequency of greater than 100 Mhz, the antenna further producing an associated vector potential A and a scalar potential phi having a frequency of greater than 100 Mhz. The system 30 includes a receiver 34 disposed within the submarine 32, the receiver 34 is configured to receive the A and Phi fields and convert the A and Phi fields into an electromagnetic signal. The receiver 34 has a superconducting element which can be a high temperature Josephson junction 24 having a first produced resonant frequency. The Josephson junction 24 converts the received A and phi fields into changes in phase in the first produced resonant frequency.

The receiver 34 can have a radio circuit 36 configured to receive emissions from the Josephson junction 24 using a separate antenna 38. Alternatively, the radio circuit 36 can be configured to receive emissions from the Josephson junction 24 directly from the Josephson junction 24 by measuring a current through the Josephson junction 24. Optionally, the system 30 can include a SQUID magnetic sensor where the SQUID magnetic sensor is shielded from magnetic fields by an EM shielding case or Faraday cage. The system 50 can have at least three transmitting antennas positioned at various locations, where the transmitting antennas 53 can be positioned on one of a satellite, an above ground fixed location, on a subterranean location, beneath a surface of the ocean, and can include at least three antennas positioned at different locations.

For navigation, the receiver 34 for the submarine 32 can have a circuit 37 configured to calculate a location of the submarine 32 with respect to the at least three transmitting antennas using triangulation. Each of the at least three antennas 22 emits an A and Phi signals indicative of a time signal and a location of the antenna. The signal indicative of location of the respective antennas can be a transmitted signal or can be associated with the transmitted signal such as a frequency or signal phase.

Figure 6:
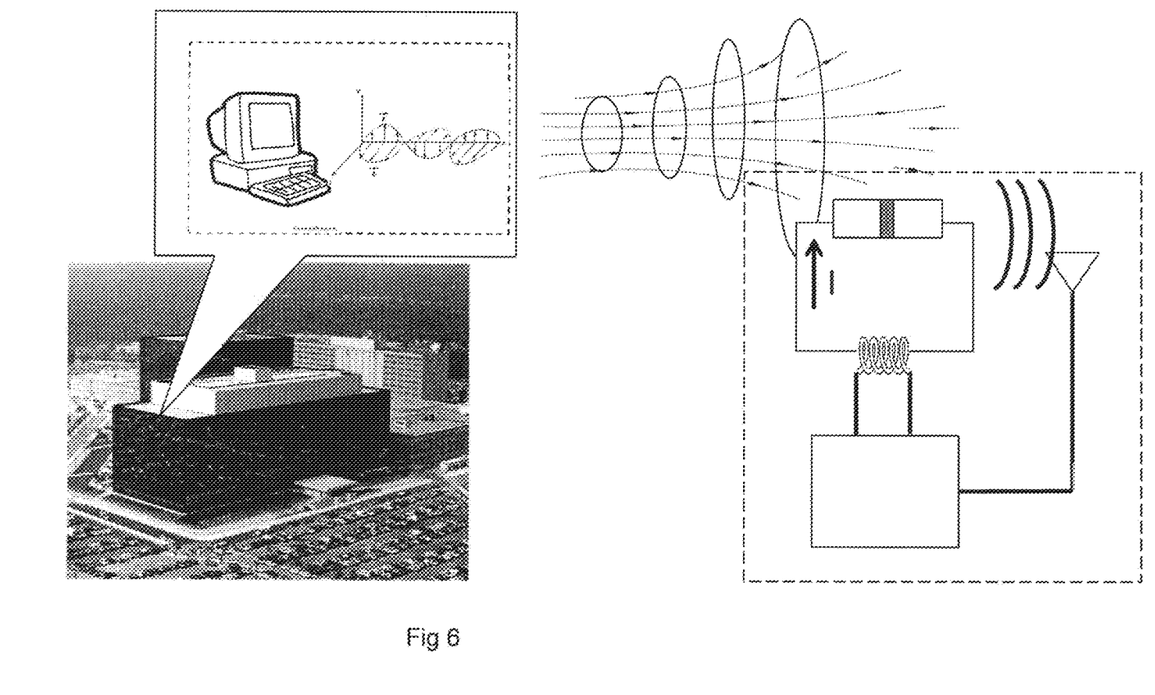
FIG. 6 represents a shielded electronic emission monitoring system.

FIG. 6, depicts a system 50 for receiving non-refracted and non-reflected A and scalar potential signals from a computer and telecom signals transmitted from computers disposed within a shielded room or space in a straight line sight through a material to a receiver. The system 50 is configured to receive A and phi transmissions from a shielded computer and telecom signals disposed within a Faraday cage. The system 50 includes a quantum receiver 56 configured to receive A and Phi fields which pass through the faraday cage. The quantum receiver 56 has a superconducting element which may be a Josephson junction or a SQUID producing a signal at a resonant frequency having a first phase, and in the presence of an A or Phi field producing a signal at the first frequency having a second phase. The system 50 for receiving non-refracted and non-reflected A and scalar potential signals has a circuit 60 configured to detect the changes in phase and produce a signal indicative of changes in the A and phi fields.

The system 50 includes any electric circuit computer which has traces that act as a transmitter antenna 53. The electrical circuit traces emits a non-refracted and non-reflected EM field at a frequency greater than 50 MHz in a first direction, and vector and electric potential in a second direction perpendicular to the first direction. The system includes a receiver 54 configured to receive the vector and electric potential A and Phi fields transmitted in the second direction which pass through the shielded room 56. The receiver 54 has a quantum receiver 56 producing a signal at a resonant frequency having a first phase, and in the presence of an A or Phi field producing a signal at the first frequency having a second phase.

The receiver includes a circuit 58 configured to detect the changes in phase and produce a signal indicative of changes in the A and phi fields. The A and phi signals are amplitude modulated and wherein the circuit is configured to detect changes in the A and phi fields detects the amount of phase change in the resonant frequency and converts this to a signal indicative of the amplitude modulated signal. Alternatively, the signals can be frequency modulated signals and wherein the circuit 58 is configured to detect changes in the A and phi fields and detects the rate of the phase change in the resonant frequency and converts this to a signal indicative of the frequency modulated signals.

The A and phi signals encode digital signals transmitted at a transmission frequency and, wherein the circuit is configured to detect changes in the A and phi fields, detects the amount of phase change in the resonant frequency and converts this to a signal indicative of the digital signals. The A and phi signals can be based on phase modulated signals and wherein the circuit 58 is configured to detect changes in the A and phi fields, detects the amount of phase change in the phase change in the resonant frequency and converts this to a signal indicative of the phase modulated signal.

The A and phi signals can encode a digital signal transmitted at a transmission frequency and, wherein the circuit is configured to detect changes in the A and phi field, detects the amount of phase change in the resonant frequency and converts this to a signal indicative of the digital signals. Alternatively, the A and phi signals are phase modulated signals and wherein the circuit is configured to detect changes in the A and phi fields detects the amount of phase change in the phase change in the resonant frequency and converts this to a signal indicative of the phase modulated signal.

Figure 7:
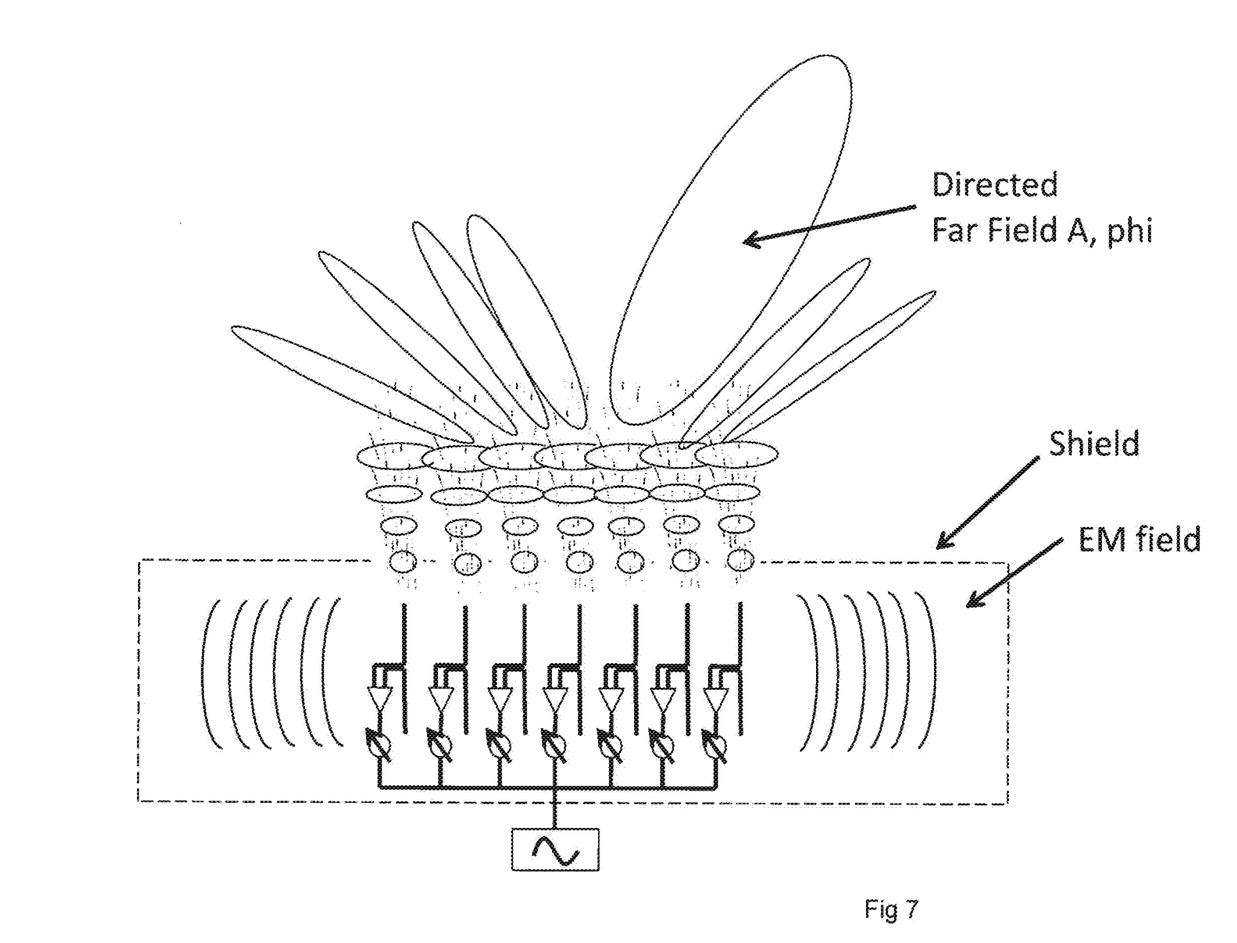
FIG. 7 represents a steerable phased array A and Phi transmission system.

FIG. 7 represents a steerable phased array A and Phi transmission system. The system includes a plurality of spaced apart antennas configured to emit both electromagnetic radiation and far field A and phi wave. The phased array has a plurality of circuits which are configured to change the phase of an input signal to any single array antenna. Unlike traditional phased array antennas, this antenna array can have the antennas configured and positioned to transmit electromagnetic radiation in the same plane as opposed to emitted out from the antenna array. The A and phi fields are emitted as propagating far field emissions perpendicular to these EM fields. By adjusting the phase of the signals presented to the individual antennas in the array the direction of the A and phi signals can be adjusted.

Figure 8:
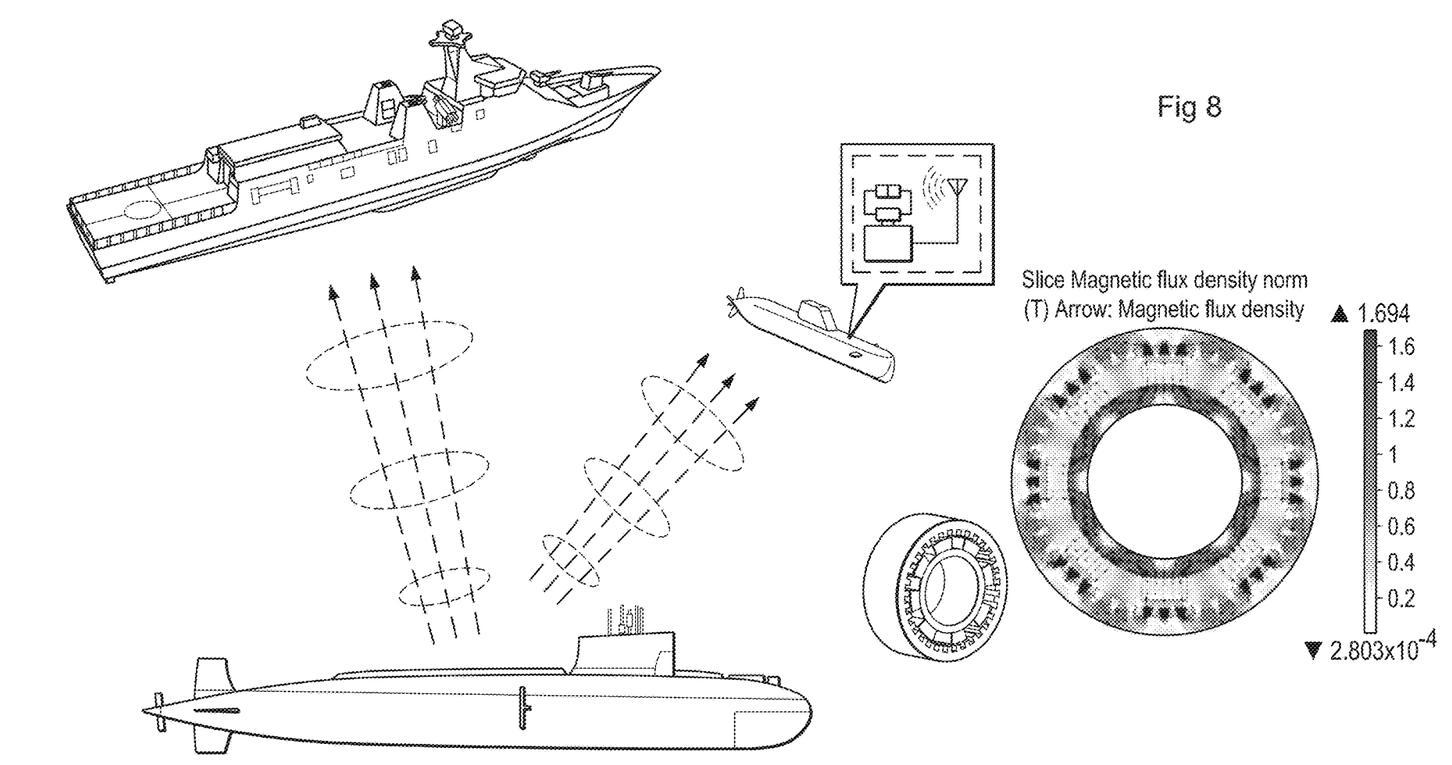
FIG. 8 represents a system for detecting a submerged vehicle.

FIG. 8 represents a system for detecting a submerged vehicle. Shown is a system for receiving non-refracted and non-reflected A and scalar potential signals from a submerged manned or unmanned vehicles transmitted from motors and power generation systems. The system 50 is configured to receive A and phi transmissions from a vibrationally shielded disposed within an underwater vehicle. The system 50 includes a quantum receiver 56 configured to receive A and Phi fields which pass through the faraday cage. The quantum receiver 56 has a superconducting element which may be a Josephson junction or a SQUID producing a signal at a resonant frequency having a first phase, and in the presence of an A or Phi field producing a signal at the first frequency having a second phase. The system 50 for receiving non-refracted and non-reflected A and scalar potential signals has a circuit 60 configured to detect the changes in phase and produce a signal indicative of changes in the A and phi fields.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail. The digital device or circuits comprises a processor, a memory system, a storage system, a communication network interface, an I/O interface, and a display interface communicatively coupled to a bus. The processor is configured to execute executable instructions (e.g., programs). In some embodiments, the processor comprises circuitry or any processor capable of processing the executable instructions.

The memory system is any memory configured to store data. Some examples of the memory system are storage devices, such as RAM or ROM. The memory system may comprise the cache memory. In various embodiments, data is stored within the memory system. The data within the memory system may be cleared or ultimately transferred to the storage system.

The storage system is any storage configured to retrieve and store data. Some examples of the storage system are flash drives, hard drives, optical drives, and/or magnetic tape. The storage system may comprise non-transitory media. In some embodiments, the digital device includes a memory system in the form of RAM and a storage system in the form of flash data. Both the memory system and the storage system comprise computer readable media which may store instructions or programs that are executable by a computer processor including the processor.

The communication network interface (com. network interface) may be coupled to a network (e.g., network) via the link. The communication network interface may support communication over an Ethernet connection, a serial connection, a parallel connection, or an ATA connection, for example. The communication network interface may also support wireless communication (e.g., 802.11 a/b/g/n, WiMax). It will be apparent that the communication network interface may support many wired and wireless standards.

The optional input/output (I/O) interface is any device that receives input from the user and output data. The optional display interface is any device that is configured to output graphics and data to a display. In one example, the display interface for a graphics adapter. It will be appreciated that not all digital devices comprise either the I/O interface or the display interface.

The hardware elements of the digital device are not limited to those depicted in the figures. A digital device may comprise more or less hardware elements than those depicted. Further, hardware elements may share functionality and still be within various embodiments described herein. For example, encoding and/or decoding may be performed by the processor and/or a co-processor, such as a processor located on a graphics processing unit (GPU).

The above-described functions and components may be comprised of instructions that are stored on a storage medium such as a computer readable medium (e.g., a non-transitory computer readable medium). The instructions may be retrieved and executed by a processor. Some examples of instructions are software, program code, and firmware. Some examples of storage medium are memory devices, tape, disks, integrated circuits, and servers. The instructions are operational when executed by the processor to direct the processor to operate in accord with embodiments of the present invention.

The present invention is described above with reference to exemplary embodiments. Various modifications may be made and other embodiments may be used without departing from the broader scope of the present invention. Therefore, these and other variations upon the exemplary embodiments are intended to be covered by the present invention. Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A communication system comprising:
   an antenna configured to produce a far field EM radiation field having a vector potential A and a scalar potential phi;
   a shield configured to block the far field EM radiation field disposed from the antenna; and
   a receiver configured to receive the A and Phi fields in absence of the far field EM radiation field and convert the A and phi fields into an electromagnetic signal.

2. The system according to claim 1 wherein the receiver comprises a pair of superconducting elements.

3. The system according to claim 2 wherein the superconducting elements are Josephson junctions that are electrically parallel having a first produced resonant frequency, and said Josephson junctions convert the received A and phi fields into changes in phase changes in the first produced resonant frequency.

4. The system according to claim 3 wherein the receiver comprises a radio circuit configured to one of, receive emissions from the Josephson junctions from an antenna, and receive signals directly from a current through the Josephson junction.

5. The system according to claim 1 wherein the receiver comprises a SQUID magnetic sensor and wherein the SQUID magnetic sensor is shielded from electric and magnetic fields.

6. The system according to claim 1 wherein the antenna is positioned on one of, a satellite, an above ground fixed location, a subterranean location, and beneath a surface of the ocean.

7. The system according to claim 1 wherein the system comprises at least three antennas positioned at various locations.

8. The system according to claim 7 wherein the receiver comprises a circuit configured to calculate a location of an electromagnetically shielded vehicle with respect to at least three antennas using triangulation.

9. The system according to claim 8 wherein each of the least three antennas emit respective A and Phi signals indicative of a time signal and a location.

10. The system according to claim 9 wherein the signal indicative of location is a frequency.

11. A navigation system comprising:
    a plurality of transmitters positioned at known predetermine locations in time and space, said transmitters respectively producing distinguishable far field EM waves and A and phi fields;
    at least one shield configured to block the far field EM waves disposed about the plurality of transmitters;
    a receiver configured to receive the A and Phi fields in the absence of the far field EM waves and convert the A and phi fields into a signal on an electromagnetic spectrum;
    a circuit configured to calculate a location based on the signal on an electromagnetic spectrum.

12. The system according to claim 11 wherein the receiver comprises a pair of Josephson Junctions configured to producing a signal at a resonant frequency having a first phase, and in the presence of the distinguishable A and Phi fields and producing a signal at the first frequency having a second phase.

13. The system according to claim 11 further comprising a circuit configured to detect a change from the first phase to a second phase and to produce a signal indicative of the distinguishable A and Phi fields.

14. A system for receiving shielded electromagnetic signals disposed within a faraday cage, the system comprising:
    a receiver configured to receive A and Phi fields in absence of a far field EM radiation field which pass through the faraday cage, the receiver having a Josephson junction producing a signal at a resonant frequency having a first phase.

15. The system according to claim 14 further comprising a circuit configured to detect the changes in phase and produce a signal indicative of changes in the A and phi fields.

16. The system according to claim 14 wherein the A and phi signals are amplitude modulated and wherein the circuit is configured to detect changes in the A and phi fields, detects the amount of phase change in the resonant frequency and converts this to a signal indicative of the amplitude modulated signal.

17. The system according to claim 14 wherein the A and phi signals are frequency modulated signals and wherein the circuit is configured to detect changes in the A and phi fields and detects the speed of the phase change in the resonant frequency and converts this to a signal indicative of the frequency modulated signals.

18. The system according to claim 14 wherein the A and phi signals encode a digital signal transmitted at a transmission frequency and wherein the circuit is configured to detect changes in the A and phi fields detects the amount of phase change in the resonant frequency and converts this to a signal indicative of the digital signals.

19. The system according to claim 14 wherein the A and phi signals are phase modulated signals and wherein the circuit is configured to detect changes in the A and phi fields detects the amount of phase change in the phase change in the resonant frequency and converts this to a signal indicative of the phase modulated signal.

\* \* \* \* \*